(12) United States Patent
Potscher et al.

(10) Patent No.: US 8,058,927 B2
(45) Date of Patent: Nov. 15, 2011

(54) AMPLIFIER MODULATION METHOD AND APPARATUS

(75) Inventors: Thomas Potscher, Villach (AT); Johan Sjostrom, Tyreso (SE); Andreas Wiesbauer, Portschach (AT); Peter Singerl, Villach (AT)

(73) Assignee: Infineon Technologies AG, Neubiberg (DE)

( * ) Notice: Subject to any disclaimer, the term of this patent is extended or adjusted under 35 U.S.C. 154(b) by 926 days.

(21) Appl. No.: 11/958,849

(22) Filed: Dec. 18, 2007

(65) Prior Publication Data
US 2009/0154544 A1   Jun. 18, 2009

(51) Int. Cl.
*H03F 3/38*   (2006.01)
(52) U.S. Cl. .......................... 330/10; 330/251
(58) Field of Classification Search ............... 330/10, 330/207 A, 251
See application file for complete search history.

(56) References Cited

U.S. PATENT DOCUMENTS

| | | | |
|---|---|---|---|
| 6,778,012 B2 * | 8/2004 | Kirn | 330/10 |
| 6,922,102 B2 | 7/2005 | Myer et al. | |
| 7,253,684 B2 * | 8/2007 | Mendenhall | 330/251 |
| 7,612,608 B2 * | 11/2009 | Kozak et al. | 330/10 |
| 2003/0058956 A1 | 3/2003 | Rosnell et al. | |
| 2004/0251962 A1 | 12/2004 | Rosnell et al. | |
| 2007/0126504 A1 | 6/2007 | Macphail | |
| 2007/0217498 A1 | 9/2007 | Tenconi | |

FOREIGN PATENT DOCUMENTS

DE   102004022839 A1   12/2005
WO      2007069191 A2    6/2007

OTHER PUBLICATIONS

Rabjohn, Gord; Wight, Jim; "Improving Efficiency, Output Power with 802.11a Out-Phasing PAs"; http://www.commsdesign.com/showArticle.jhtml?articleID=17300189 ,Jan. 9, 2004.
Leach, Jr., W. Marshal; "The Class-D Amplifier," Introduction to Electroacoustics and Audio Amplifier Design, 2nd Ed., 2001.
Long, Anthony; Yao, Jingshi; Long, Stephen I.; "A 13W Current Mode Class D High Efficiency 1 GHz Power Amplifier", Department of Electrical and Computer Engineering, University of California, Santa Barbara, Aug. 2002.
Rosnell, J. Varis, Bandpass Pulse-Width Modulation (BP-PWM). Nokia, TP Wireless Platforms, FIN-24100 Salo, Finland., Jan. 5, 2005 IEEE, pp. 731-734.
Raabetal., "RF and Microwave Power Amplifier and Transmitter Technologies"—Part 2, High Frequency Electronics, 2003 Summit Technical Media, LLC., pp. 22-36.
Cripps, Steve C. "RF Power Amplifiers for Wireless Communications, Second Edition". Published by Artech House, pp. 173-199, May 2006.

* cited by examiner

*Primary Examiner* — Khanh Nguyen
(74) *Attorney, Agent, or Firm* — Coats & Bennett, P.L.L.C.

(57) ABSTRACT

A signal is modulated by generating a pulse-width modulation signal and applying the pulse-width modulation signal to an input of a switched-mode amplifier. An output of the amplifier is coupled to a filter operable to impart either differential mode oscillations or common mode oscillations at the amplifier output based on the duty cycle of the pulse-width modulation signal. The duty cycle of the pulse-width modulation signal is varied to impart amplitude modulations at the amplifier output.

21 Claims, 7 Drawing Sheets

AMPLIFIER MODULATION METHOD AND APPARATUS

BACKGROUND OF THE INVENTION

The present invention generally relates to signal modulation, and particularly relates to imparting signal modulations using a switched-mode power amplifier.

In many fields, for example in third and higher generation base stations, bandwidth-optimized modulation schemes are used for transmitting information. Bandwidth-optimized modulation schemes require a non-constant envelope, and thus have a relatively high peak-to-average power ratio (PAR). Linear power amplifiers such as class AB amplifiers are typically used because they offer high linearity. However, class AB amplifiers must be driven with a high back-off to achieve good linearity across a wide operating range. Backing-off a class AB amplifier results in lower transmitted power, and thus reduced overall power efficiency. Class AB amplifiers must also be sized to handle peak power levels, but are often operated at much lower power levels. The efficiency of class AB amplifiers further suffers when operated below peak power levels.

Other conventional signal modulation techniques exist for Radio Frequency (RF) applications. However, each of the techniques suffers from poor power efficiency, poor linearity, complexity or other limitations. For example, supply voltage regulation techniques have poor power efficiency because the voltage regulator must have a large bandwidth. Linearity is problematic for Doherty amplifiers. Out-phasing, where two equally sized power amplifier outputs are combined via a power combiner, constantly dissipates power. Delta sigma modulators used in conjunction with a high-power output stage tend to be less efficient than their pulse-width modulator counterparts.

Pulse-width modulators conventionally drive a switched-mode power amplifier such as a class-D or class-J amplifier. Amplitude modulations are imparted at the amplifier output by varying the duty cycle of the pulse-width modulation signal applied to the amplifier input. However, switched-mode power amplifiers typically have a high-value inductor located between the amplifier output and the DC supply voltage for limiting RF currents at the DC power supply. The high supply-side inductance causes large voltage peaks at the drains of the amplifier switches, which can cause device damage. Moreover, the high supply-side inductance reduces the amplifier's reaction time to on-off and off-on transitions in the pulse-width modulation input control signal. This limits overall circuit performance because amplitude modulations are imparted based on how quickly the duty cycle of the pulse-width modulation control signal can be varied, i.e., how quickly the on-off/off-on transitions occur in the pulse-width modulation control signal.

SUMMARY OF THE INVENTION

According to the methods and apparatus taught herein, a signal is modulated by generating a pulse-width modulation signal and applying the pulse-width modulation signal to an input of a switched-mode amplifier. An output of the amplifier is coupled to a filter operable to impart either differential mode oscillations or common mode oscillations at the amplifier output based on the duty cycle of the pulse-width modulation signal. The duty cycle of the pulse-width modulation signal is varied to impart amplitude modulations at the amplifier output.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
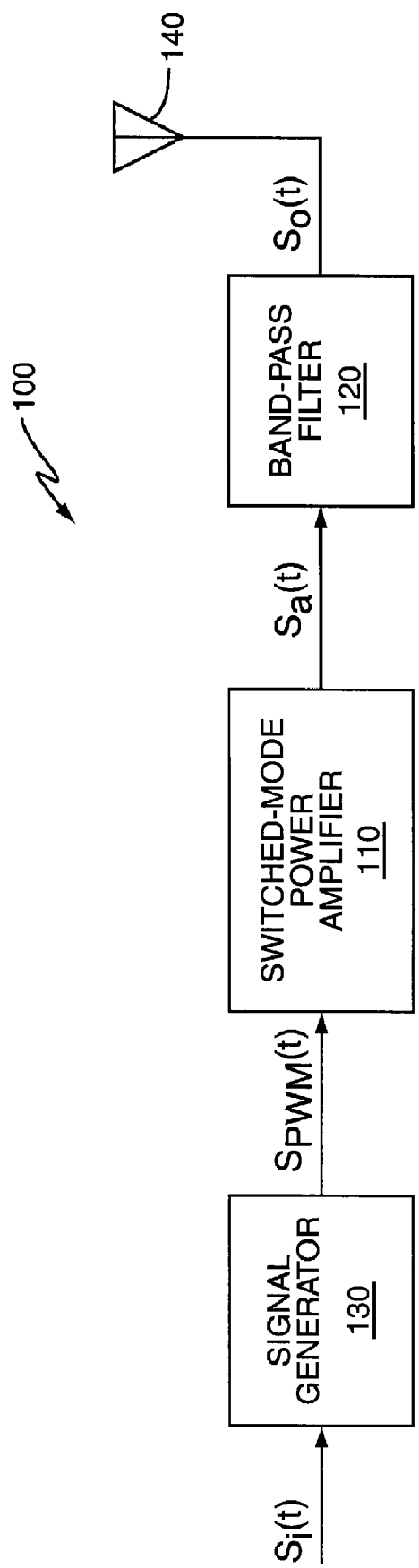
FIG. 1 is a block diagram of an embodiment of an RF transmitter including a switched-mode power amplifier and band-pass filter.

FIG. 1 illustrates an embodiment of an RF transmitter 100 for transmitting signals having amplitude modulations imparted by a switched-mode power amplifier 110. The power amplifier 110 imparts amplitude modulations corresponding to variations in the duty cycle of a pulse-width modulation (PWM) control signal applied to the amplifier input. The reaction time of the power amplifier 110 to duty cycle variations in the PWM control signal is not limited by a high supply-side inductance like conventional switched-mode power amplifiers. Instead, a band-pass filter 120 is coupled to the amplifier output in such a way to enable fast amplifier reaction time while still limiting RF currents at the DC power supply. Accordingly, the transmitter 100 is suitable for both low and high-performance RF applications.

Figure 2:
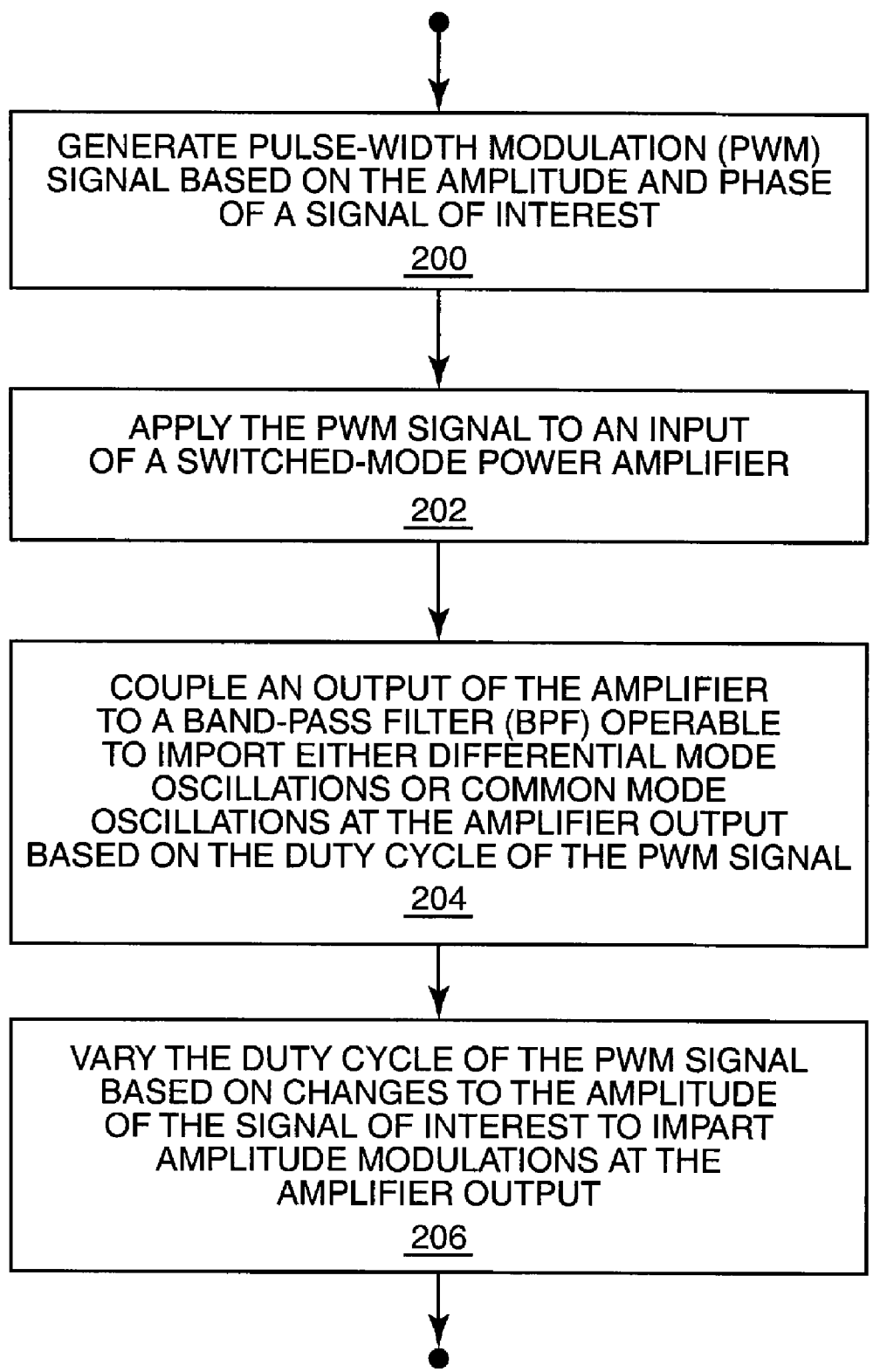
FIG. 2 is a logic flow diagram of an embodiment of processing logic for imparting amplitude modulations at the output of a switched-mode power amplifier.

In more detail, a signal generator 130 processes a signal of interest $s_i(t)$ and generates a PWM control signal $s_{PWM}(t)$ based on the amplitude and phase of the signal of interest, e.g., as illustrated by Step 200 of FIG. 2. The PWM control signal is applied to the input of the switched-mode power amplifier 110, e.g., as illustrated by Step 202 of FIG. 2. The amplifier output is coupled to the band-pass filter 120 which imparts either differential mode oscillations or common mode oscillations at the amplifier output based on the duty cycle of the PWM control signal, e.g., as illustrated by Step 204 of FIG. 2. That is, the amplifier output operates in a differential mode when the PWM control signal is active (i.e., oscillating) and in a common mode when the PWM control signal is inactive (i.e., steady-state). Amplitude modulations are imparted on the amplifier output signal $s_a(t)$ by switching between the differential operating mode and the common operating mode. To this end, the signal generator 130 varies the duty cycle of the PWM control signal based on changes to the amplitude of the signal of interest, e.g., as illustrated by Step 206 of FIG. 2. Phase modulations are imparted at the amplifier output by varying the phase of the PWM control signal based on changes to the phase of the signal of interest.

The modulated signal $s_o(t)$ is then transferred to an antenna 140 for wireless transmission.

Figure 3:
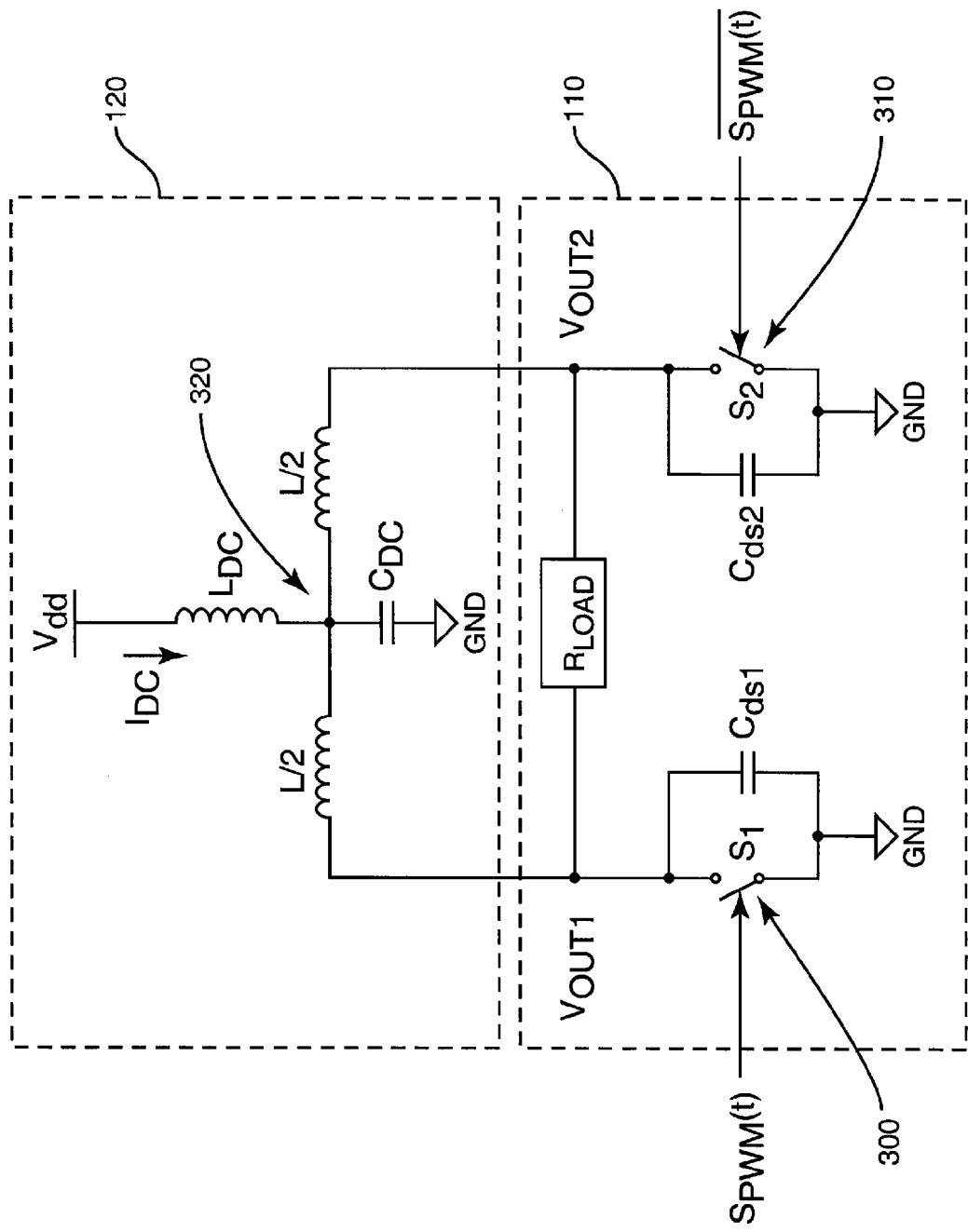
FIG. 3 is a block diagram of one embodiment of a switched-mode power amplifier and band-pass filter.

FIG. 3 illustrates one embodiment of the switched-mode power amplifier 110 and band-pass filter 120. According to this embodiment, the amplifier 110 is a class-$D^{-1}$ amplifier. In other embodiments, the amplifier may be of a different switched-mode type such as class-D, class-E, class-F, class-J, or the like. Regardless, the amplifier 110 has two symmetric branches 300, 310. Each branch 300, 310 comprises a switch $S_1/S_2$ such as a transistor. Both switches $S_1$ and $S_2$ have a parasitic drain-to-source capacitance shown as $C_{ds1}$ and $C_{ds2}$ in FIG. 3, respectively. The first switch $S_1$ is actuated by the PWM control signal $s_{PWM}(t)$. The second switch $S_2$ is actuated by a 180° out-of-phase version of the PWM control signal $\overline{s_{PWM}(t)}$. This way, when the PWM control signal is active (i.e., oscillating), only one switch is on or closed at a time. The drain of the first switch $S_1$ is coupled to a first single-ended output node $V_{out1}$. The drain of the second switch $S_2$ is coupled to a second single-ended output node $V_{out2}$. A load ($R_{LOAD}$) couples the first and second output nodes $V_{out1}$ and $V_{out2}$ together. The single-ended amplifier outputs $V_{out1}$ and $V_{out2}$ taken together form a differential amplifier output denoted as $V_{out1} - V_{out2}$ herein.

The band-pass filter 120 is coupled to the differential amplifier output $V_{out1} - V_{out2}$ and arranged to impart differential mode oscillations at the amplifier output when the PWM control signal is active and common mode oscillations when the control signal is inactive. Switching between differential and common mode oscillations imparts amplitude modulations at the differential amplifier output $V_{out1} - V_{out2}$ as will be described in more detail later. Thus, amplitude modulations are imparted at the amplifier output by varying the duty cycle of the PWM control signal, i.e., by varying the amount of time the PWM control signal is active versus inactive.

According to one embodiment, the band-pass filter 120 includes a supply-side inductor $L_{DC}$ having one node coupled to a DC voltage supply ($V_{dd}$) and the other node coupled to a first node of a supply-side capacitor $C_{DC}$. The other capacitor node is coupled to ground (GND). A second inductor L/2 is coupled between the supply-side inductor $L_{DC}$ and capacitor $C_{DC}$ to the first single-ended amplifier output $V_{out1}$. A third inductor L/2 is symmetrically coupled between the supply-side inductor $L_{DC}$ and capacitor $C_{DC}$ to the second single-ended amplifier output $V_{out2}$. The second and third inductors are selected to have approximately the same L/2 inductance.

The inductances of the supply-side inductor $L_{DC}$ and the two symmetric inductors L/2 are selected so that a virtual ground node 320 also known as AC ground is created at the intersection of the three inductors and the supply-side capacitor $C_{DC}$ as shown in FIG. 3. According to one embodiment, $L_{DC} \gg L$ where L is given by:

$$L = \frac{1}{(2\pi f_c)^2 C_{ds}} \quad (1)$$

where $C_{ds}$ is the drain-to-source capacitance of a respective transistor acting as switch and fc is the center frequency.

This way, the supply-side inductor can be set large enough to prevent RF current draw from the DC voltage supply $V_{dd}$ during amplifier operation. However, the inductance of the symmetric inductors L/2 can be set low enough so that the virtual ground node 320 can source RF currents during amplifier operation via ground. As such, only DC current is drawn from the DC supply voltage, yet RF currents provided by the virtual ground node 320 enable fast amplifier switching for accommodating high-performance RF applications. According to one embodiment, $C_{DC} \gg C_{ds}$ and the minimum size of the supply-side capacitor $C_{DC}$ depends on the duty cycle of the PWM control signal and the size of the switches $S_1$ and $S_2$.

Operation of the switched-mode power amplifier 110 is described next. When either switch $S_1$ or $S_2$ is turned on, the virtual ground node 320 provides both DC and RF currents to the corresponding amplifier branch 300, 310. In turn, the voltage at the corresponding single-ended amplifier output rises, approaching a peak value. The same occurs in the other amplifier branch when the PWM control signal changes state. The continued oscillation of the PWM control signal causes differential oscillations at the amplifier output $V_{out1} - V_{out2}$.

The differential mode oscillations are converted to common mode oscillations when the PWM control signal is turned off or inactivated. When the PWM signal is inactive, both switches $S_1$ and $S_2$ are open. Thus, no current flows through either switch. When the PWM signal is first inactivated, a first resonating circuit is formed by the first symmetric inductor L/2 and the first parasitic capacitor $C_{ds1}$. Likewise, a second resonating circuit is formed by the second symmetric inductor L/2 and the second parasitic capacitor $C_{ds2}$. The two resonating circuits run out-of-phase with each other when the PWM control signal is first inactivated.

However, the load $R_{LOAD}$ couples the two resonating circuits together. Moreover, both resonating circuits continue to oscillate after the PWM control signal is inactivated. As a result, the resonating circuits move toward each other by 90° while a small amount of energy is drained into the load. Eventually, the first symmetric inductor L/2 and the first parasitic capacitor $C_{ds1}$ resonate in-phase with the second inductor L/2 and the second parasitic capacitor $C_{ds2}$. This yields common mode oscillations at the differential amplifier output $V_{out1} - V_{out2}$ The common mode oscillations preserve most of the energy stored in the band-pass filter 120 when the PWM control signal is inactive. This energy is used to accelerate operation of the switched-mode power amplifier 110 when the PWM signal is subsequently reactivated, improving amplifier response time. Amplitude modulations are imparted on the amplifier output signal by varying the duty cycle of the PWM control signal which changes the ratio of differential to common mode oscillations at the differential amplifier output.

Figure 4:
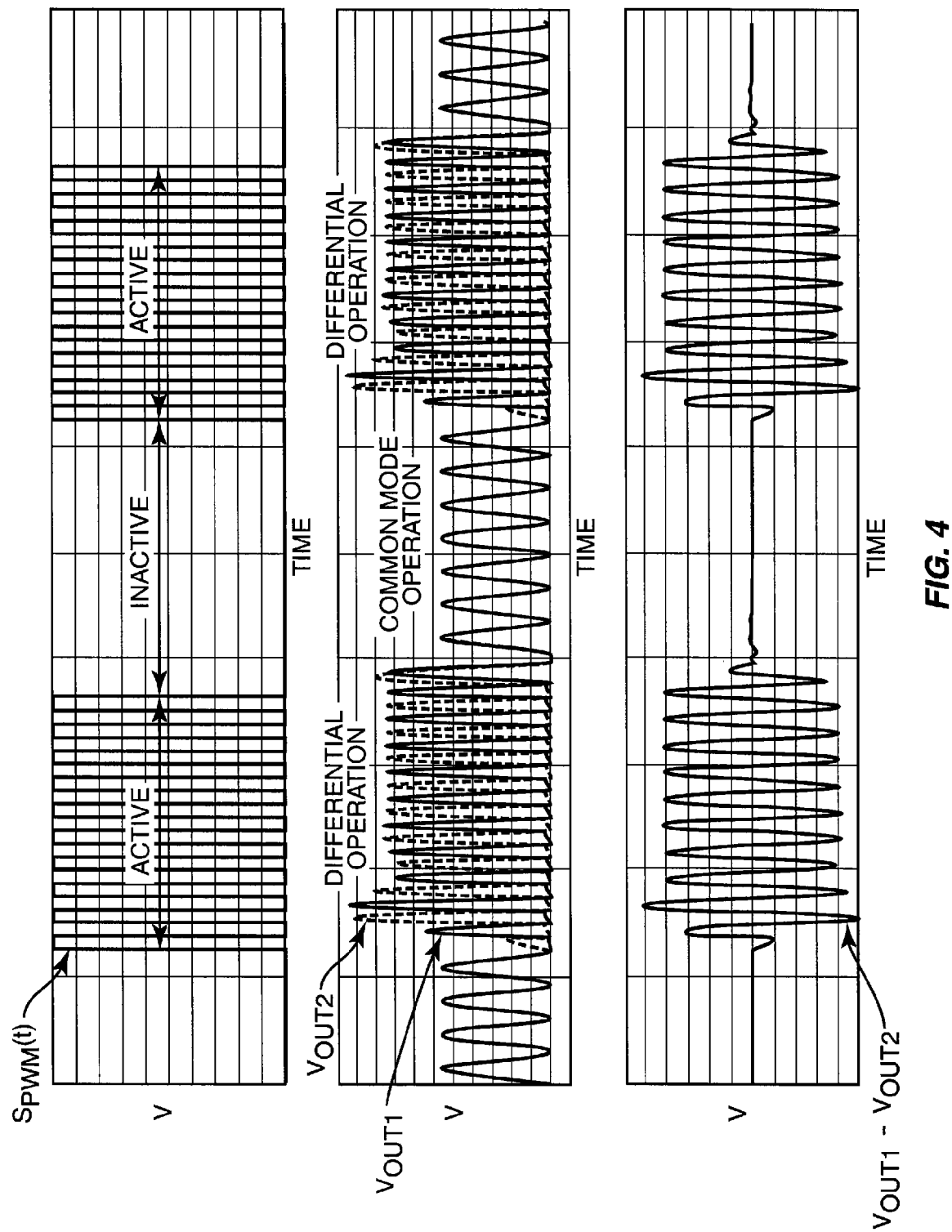
FIG. 4 is a first series of exemplary timing diagrams illustrating the operation of the switched-mode power amplifier and band-pass filter of FIG. 3.

FIG. 4 illustrates three exemplary timing diagrams showing operation of the switched-mode power amplifier 110 in response to the PWM control signal $s_{PWM}(t)$. The uppermost timing diagram shows the PWM control signal. According to this purely illustrative example, the PWM control signal oscillates between a positive voltage and zero volts when active and remains at zero volts when inactive. The control signal has a 50% duty cycle in this example, i.e., is active (oscillates) half the time and inactive (steady-state) the other half. The middle timing diagram shows the amplifier response to the PWM control signal at the single-ended amplifier outputs $V_{out1}$ and $V_{out2}$. The amplifier output operates in a differential mode when the PWM control signal is active.

That is, the band-pass filter 120 coupled to the amplifier output causes the single-ended amplifier outputs $V_{out1}$ and $V_{out2}$ to have voltage oscillations that are approximately 180° out-of-phase. When the PWM control signal is subsequently inactivated, the resonating circuits formed by the symmetric inductors L/2 and the parasitic capacitors $C_{ds1}$ and $C_{ds2}$ cause the differential single-ended amplifier outputs to align in-phase as shown by the region labeled 'COMMON MODE OPERATION' in the middle timing diagram of FIG. 4. Converting the differential output oscillations to common mode oscillations reduces the signal amplitude at the differential amplifier output $V_{out1}-V_{out2}$ as shown by the bottommost timing diagram of FIG. 3, where the common mode oscillation frequency $f_{cm}$ is given by:

$$f_{cm} = \frac{1}{2\pi\sqrt{2C_{ds}L}} \quad (2)$$

Figure 5:
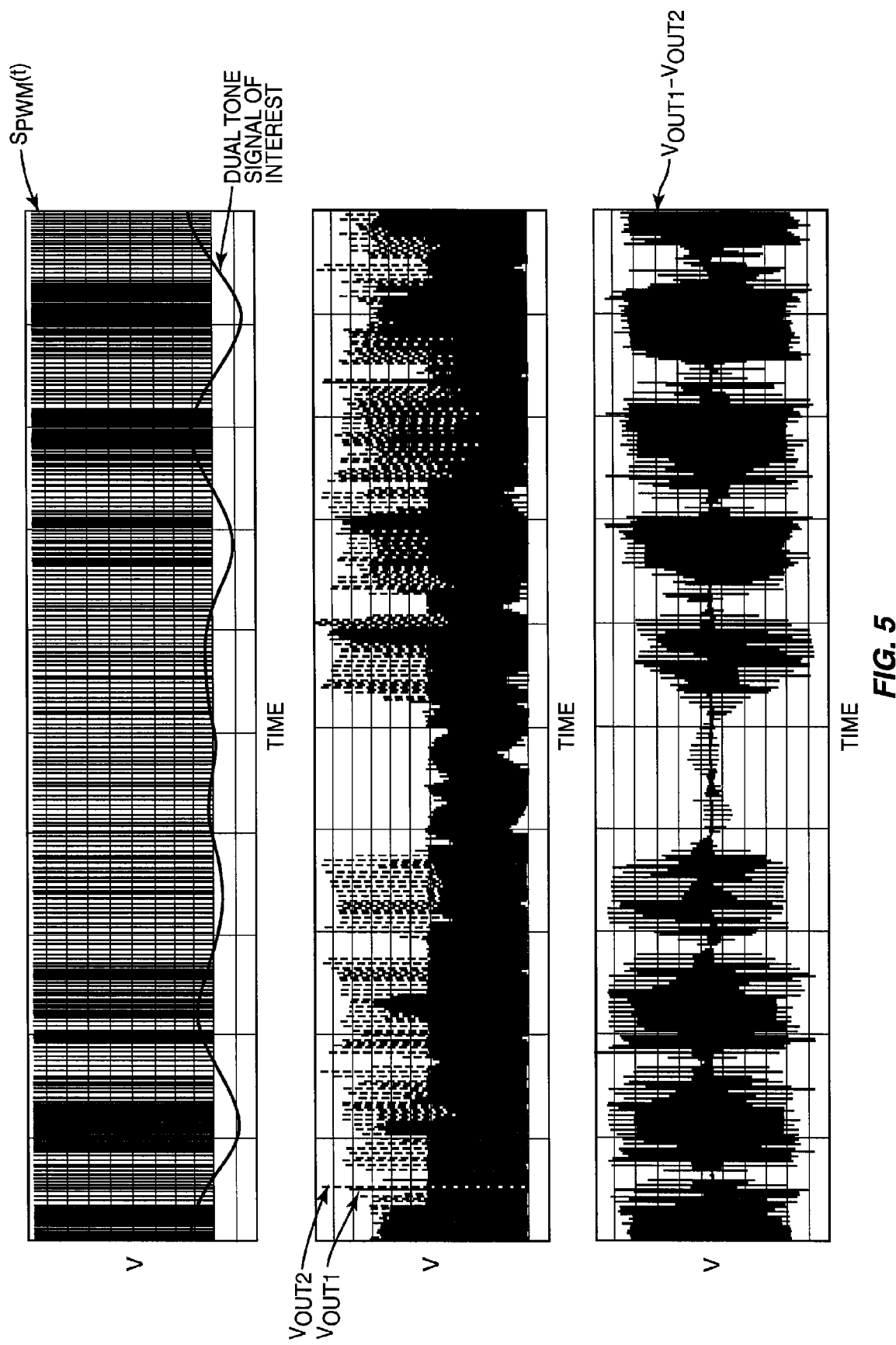
FIG. 5 is a second series of exemplary timing diagrams illustrating the operation of the switched-mode power amplifier and band-pass filter of FIG. 3.

This way, amplitude modulations are imparted at the differential amplifier output based on the duty cycle of the PWM control signal. Also, converting the differential mode oscillations to common mode oscillations when the control signal is inactive preserves most of the energy stored in the band-pass filter 120. The stored energy is re-converted to differential oscillations when the PWM signal is re-activated, improving the response time of the switched-mode power amplifier 110. FIG. 5 illustrates three additional exemplary timing diagrams showing operation of the switched-mode power amplifier 110 in response to a PWM control signal $s_{PWM}(t)$ derived from a dual tone signal of interest.

Figure 6:
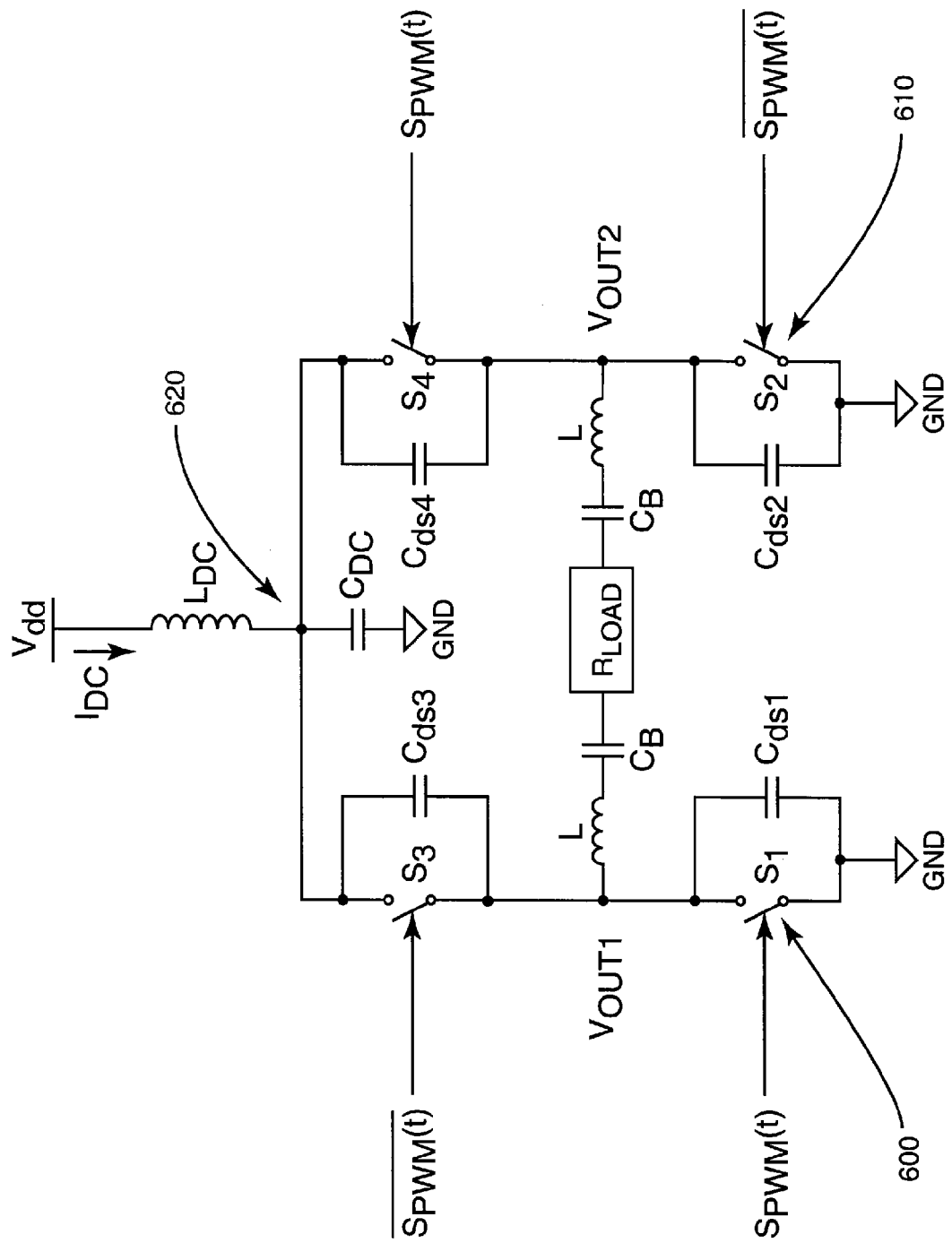
FIG. 6 is a block diagram of another embodiment of a switched-mode power amplifier and band-pass filter.

FIG. 6 illustrates another embodiment of the switched-mode power amplifier 110 and band-pass filter 120. According to this embodiment, the amplifier 110 comprises a class-D amplifier arranged in an H-bridge configuration. Particularly, the amplifier 100 includes two symmetric branches 600, 610. Each branch 600, 610 includes two switches connected in series ($S_1/S_3$ and $S_2/S_4$). The first branch 600 has a single-ended output node $V_{out1}$ between switches $S_1$ and $S_3$. The second branch 610 similarly has a single-ended output node $V_{out2}$ between switches $S_2$ and $S_4$. Each switch has a corresponding parasitic capacitance $C_{dsn}$. A supply-side inductor $L_{dc}$ shields the DC supply voltage ($V_{dd}$) from RF currents while a supply-side capacitor $C_{dc}$ has one node coupled to ground (GND) and the other node coupled to the supply-side inductor $L_{dc}$ to form a virtual ground node 620. The virtual ground node 620 provides DC and RF currents during amplifier operation as previously described herein.

The single-ended outputs $V_{out1}$ and $V_{out2}$ are coupled together via a load $R_{LOAD}$ connected in series with two symmetric inductors L and two symmetric capacitors $C_B$. The symmetric inductors L of this embodiment are twice the size of those used in the switched-mode power amplifier embodiment of FIG. 3 to minimize switching losses. Two symmetric resonator circuits are created when the PWM control signal is inactive as previously described herein. According to this embodiment, the first resonator circuit includes the first symmetric inductor L, first symmetric capacitor $C_B$ and parasitic capacitances $C_{ds1}$ and $C_{ds3}$ associated with switches $S_1$ and $S_3$ of the first amplifier branch 600. Likewise, the second resonator circuit includes the second symmetric inductor L, second symmetric capacitor $C_B$ and parasitic capacitances $C_{ds2}$ and $C_{ds4}$ associated with switches $S_2$ and $S_4$ of the second amplifier branch 610.

The symmetric resonator circuits convert differential mode oscillations at the differential amplifier output to common mode oscillations when the PWM control signal is inactive as previously described herein. This way, amplitude modulations may be imparted at the differential amplifier output by switching between differential mode and common mode oscillations. The symmetric resonator circuits also preserve at least some of the energy stored by the band-pass filter 120 when the PWM control signal is inactive also as previously described herein. The stored energy is used to improve the amplifier response time when the PWM control signal is subsequently reactivated. Amplitude modulations are imparted at the differential amplifier output by varying the duty cycle of the PWM control signal, i.e., by varying the amount of time the PWM control signal is active versus inactive.

Figure 7:
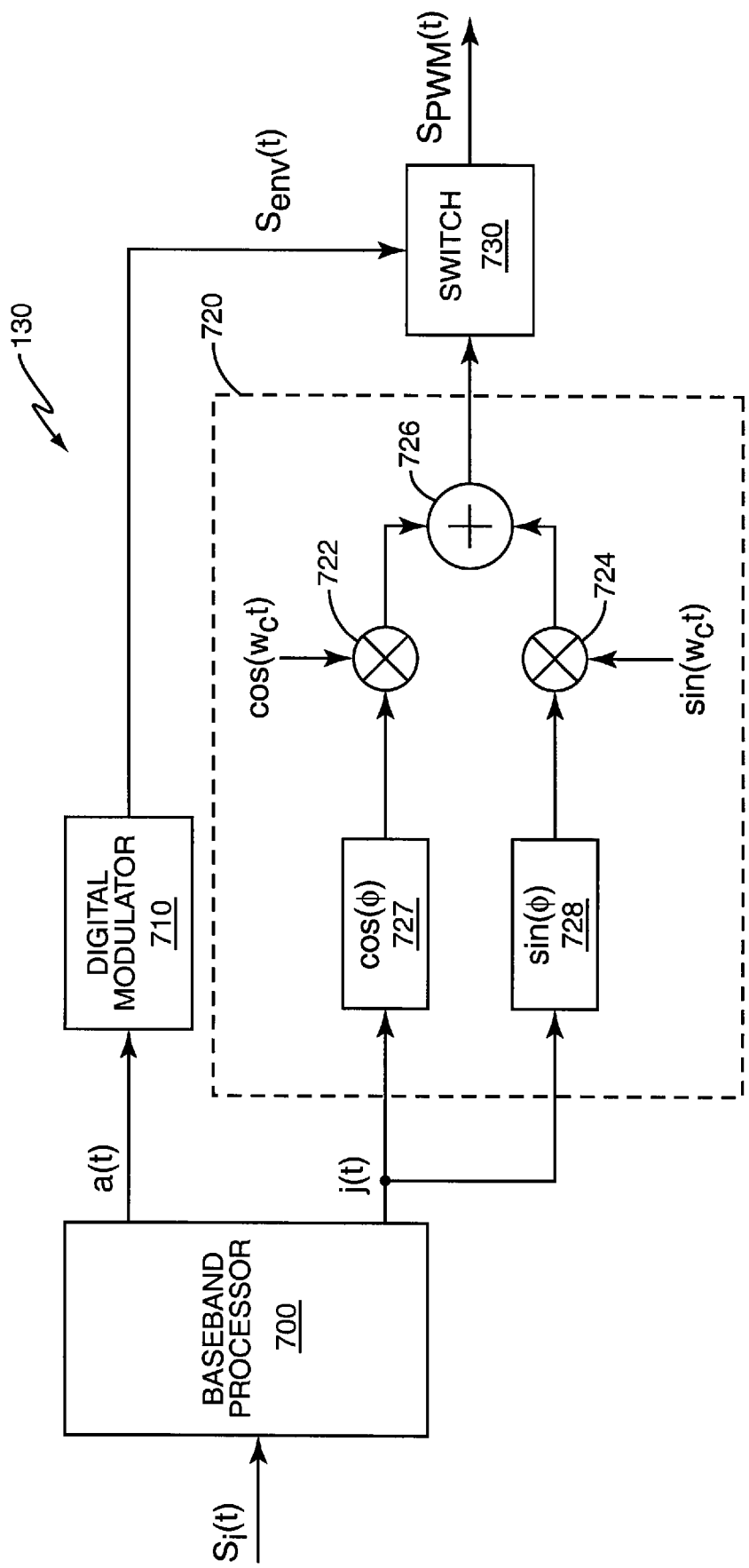
FIG. 7 is a block diagram of an embodiment of a signal generator for generating a pulse-width modulation control signal.

FIG. 7 illustrates an embodiment of the signal generator 130 for varying the duty cycle of the PWM control signal. According to this embodiment, the signal generator 130 comprises a baseband processor 700, a modulator 710, an oscillator 720, and a switch 730. The baseband processor 700 extracts separate amplitude a(t) and phase j(t) information from a signal of interest $s_i(t)$. The modulator 710 outputs an envelope signal $s_{env}(t)$ based on the amplitude information. In one embodiment, the modulator 710 is a pulse-width modulator. In another embodiment, the modulator 710 is a Deltas-Sigma modulator. Either way, the envelope signal $s_{env}(t)$ is generated by modulating the amplitude information a(t), preferably digitally.

The envelope signal controls activation of the switch 730. The switch output is active when the switch 730 is enabled by the envelope signal and inactive otherwise. Thus, the output of the switch 730 is pulse-width modulated in that it has a variable duty cycle corresponding to changes in the amplitude of the signal of interest. The switch output is applied to the amplifier input as a PWM control signal which imparts amplitude modulations at the differential amplifier output $V_{out1}-V_{out2}$ corresponding to the amplitude of the signal of interest.

Phase modulations may also be imparted at the amplifier output by varying the phase of the PWM control signal output by the switch 730. The oscillator 720 varies the phase of the switch output based on the phase information extracted from the signal of interest by the baseband processor 700. To this end, first and second mixers 722, 724 and a summer 726 cause the oscillator output to oscillate around a carrier frequency of $\omega_c=2\pi f_c$ as is well known in the art. Respective cosine and sine phase shifters 727, 728 vary the phase of the oscillator output based on the phase information j(t) extracted from the signal of interest. Thus, the phase of the PWM control signal output by the switch 730 imparts phase modulations at the differential amplifier output $V_{out1}-V_{out2}$ while the duty cycle of the PWM control signal imparts corresponding amplitude modulations.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of modulating a signal, comprising:
   generating a pulse-width modulation signal;
   applying the pulse-width modulation signal to an input of a switched-mode amplifier;
   coupling an output of the amplifier to a filter operable to impart differential mode oscillations at the amplifier output when the amplifier is activated by the pulse-width modulation signal and convert the differential mode oscillations to common mode oscillations when the amplifier is inactivated by the pulse-width modulation signal; and
   varying the duty cycle of the pulse-width modulation signal to impart amplitude modulations at the amplifier output.

2. The method of claim 1, wherein imparting differential mode oscillations at the amplifier output when the amplifier is activated by the pulse-width modulation signal comprises imparting oscillations at first and second symmetric branches of the amplifier output which are approximately 180° out-of-phase.

3. The method of claim 1, wherein converting the differential mode oscillations to common mode oscillations when the amplifier is inactivated by the pulse-width modulation signal comprises converting at least some energy stored in the filter when the amplifier is active to common mode oscillations when the amplifier is inactive.

4. The method of claim 1, wherein coupling the amplifier output to the filter comprises:
coupling a first inductor in series with a capacitor to a DC supply voltage at one end and ground at the other to form a virtual ground node between the first inductor and the capacitor;
coupling a second inductor between the virtual ground node and a first branch of the amplifier output;
coupling a third inductor between the virtual ground node and a second branch of the amplifier output, the first and second amplifier output branches being symmetric; and
coupling a load between the symmetric amplifier output branches and in parallel with the second and third inductors in series.

5. The method of claim 1, wherein generating the pulse-width modulation signal comprises:
extracting separate amplitude and phase information from a signal of interest;
generating an envelope signal based on the amplitude information;
altering the phase of an oscillating signal based on the phase information; and
altering the duty cycle of the oscillating signal based on the envelope signal.

6. A radio frequency transmitter, comprising:
a signal generator operable to output a pulse width modulation signal;
a switched-mode amplifier having an input configured to receive the pulse-width modulation signal;
a circuit coupled to an output of the amplifier and operable to impart differential mode oscillations at the amplifier output when the amplifier is activated by the pulse-width modulation signal and convert the differential mode oscillations to common mode oscillations when the amplifier is inactivated by the pulse-width modulation signal; and
wherein the signal generator is operable to vary the duty cycle of the pulse-width modulation signal to impart amplitude modulations to the amplifier output.

7. The radio frequency transmitter of claim 6, wherein the circuit is a band-pass filter operable to impart oscillations at first and second symmetric branches of the amplifier output which are approximately 180° out-of-phase when the amplifier is activated by the pulse-width modulation signal.

8. The radio frequency transmitter of claim 6, wherein the circuit is a band-pass filter is operable to convert at least some energy stored in the band-pass filter when the amplifier is active to common mode oscillations when the amplifier is inactive.

9. The radio frequency transmitter of claim 6, wherein the circuit comprises:
a first inductor in series with a capacitor coupled to a DC supply voltage at one end and ground at the other end to form a virtual ground node between the first inductor and the capacitor;
a second inductor coupled between the virtual ground node and a first branch of the amplifier output;
a third inductor coupled between the virtual ground node and a second branch of the amplifier output, the first and second amplifier output branches being symmetric; and
a load coupled between the symmetric amplifier output branches and in parallel with the second and third inductors in series.

10. The radio frequency transmitter of claim 6, wherein the signal generator comprises:
a baseband processor operable to extract separate amplitude and phase information from a signal of interest;
a modulator operable to output an envelope signal based on the amplitude information;
an oscillator operable to alter the phase of an oscillating signal based on the phase information; and
a switch operable to alter the duty cycle of the oscillating signal based on the envelope signal.

11. A method of modulating a signal, comprising:
applying a pulse-width modulation signal to an input of a switched-mode amplifier having an output corresponding to the phase and duty cycle of the pulse-width modulation signal;
coupling the amplifier output to a circuit operable to configure the amplifier output in either a differential operating mode with differential mode oscillations imparted at the amplifier output when the amplifier is activated by the pulse-width modulation signal or a common operating mode with the differential mode oscillations converted to common mode oscillations when the amplifier is inactivated by the pulse-width modulation signal, based on the duty cycle of the pulse-width modulation signal; and
switching the amplifier output between the differential and common operating modes based on variations in the duty cycle of the pulse-width modulation signal to impart amplitude modulations at the amplifier output.

12. The method of claim 11, wherein the circuit is a band-pass filter and the differential mode oscillations are imparted at the amplifier output by imparting oscillations at first and second symmetric branches of the amplifier output which are approximately 180° out-of-phase.

13. The method of claim 11, wherein the circuit is a band-pass filter and the differential mode oscillations are converted to the common mode oscillations by converting at least some of the energy stored in the band-pass filter when the amplifier is active to common mode oscillations when the amplifier is inactive.

14. The method of claim 11, wherein coupling the amplifier output to the circuit comprises:
coupling a first inductor in series with a capacitor to a DC supply voltage at one end and ground at the other end to form a virtual ground node between the first inductor and the capacitor;
coupling a second inductor between the virtual ground node and a first branch of the amplifier output;
coupling a third inductor between the virtual ground node and a second branch of the amplifier output, the first and second amplifier output branches being symmetric; and
coupling a load between the symmetric amplifier output branches and in parallel with the second and third inductors in series.

15. A radio frequency modulator, comprising:
a switched-mode amplifier having an input operable to receive a pulse-width modulation signal and an output;
a circuit coupled to the amplifier output and operable to configure the amplifier output in either a differential operating mode with differential mode oscillations imparted at the amplifier output when the amplifier is activated by the pulse-width modulation signal or a common operating mode with the differential mode oscillations converted to common mode oscillations when the amplifier is inactivated by the pulse-width modulation signal, based on the duty cycle of the pulse-width modulation signal; and wherein the amplifier output switches between the differential and common operating modes based on variations in the duty cycle of the pulse-width modulation signal to impart amplitude modulations at the amplifier output.

16. The radio frequency modulator of claim 15, wherein the circuit is a band-pass filter operable to impart oscillations at first and second symmetric branches of the amplifier output which are approximately 180° out-of-phase when the amplifier is active.

17. The radio frequency modulator of claim 15, wherein the circuit is a band-pass filter operable to convert at least some of the energy stored in the band-pass filter when the amplifier is active to common mode oscillations when the amplifier is inactive.

18. The radio frequency modulator of claim 15, wherein the circuit comprises:
a first inductor coupled in series with a capacitor to a DC supply voltage at one end and ground at the other end to form a virtual ground node between the first inductor and the capacitor;
a second inductor coupled between the virtual ground node and a first branch of the amplifier output;
a third inductor coupled between the virtual ground node and a second branch of the amplifier output, the first and second amplifier output branches being symmetric; and
a load coupled between the symmetric amplifier output branches and in parallel with the second and third inductors in series.

19. The radio frequency modulator of claim 15, wherein the switched-mode amplifier comprises a class-$D^{-1}$ amplifier.

20. The radio frequency modulator of claim 15, wherein the switched-mode amplifier comprises an H-bridge class-D amplifier.

21. A radio frequency modulator, comprising:
a switched-mode amplifier having an input configured to receive a pulse-width modulation signal and an output corresponding to the phase and duty cycle of the pulse-width modulation signal;
means for configuring the amplifier output in either a differential operating mode with differential mode oscillations imparted at the amplifier output when the amplifier is activated by the pulse-width modulation signal or a common operating mode with the differential mode oscillations converted to common mode oscillations when the amplifier is inactivated by the pulse-width modulation signal, based on the duty cycle of the pulse-width modulation signal; and
wherein the amplifier output switches between the differential and common operating modes based on variations in the duty cycle of the pulse-width modulation signal to impart amplitude modulations at the amplifier output.

* * * * *